(12) United States Patent
Hou

(10) Patent No.: US 7,566,647 B2  
(45) Date of Patent: Jul. 28, 2009

(54) METHOD OF DISPOSING AND ARRANGING DUMMY PATTERNS

(75) Inventor: Hsin-Ming Hou, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 176 days.

(21) Appl. No.: 11/457,140

(22) Filed: Jul. 12, 2006

(65) Prior Publication Data

US 2008/0124910 A1    May 29, 2008

(51) Int. Cl.  
    *H01L 21/44* (2006.01)
(52) U.S. Cl. .................. 438/612; 438/666; 438/688
(58) Field of Classification Search ............... 438/668, 438/609, 666, 622, 612, 688  
    See application file for complete search history.

(56) References Cited

U.S. PATENT DOCUMENTS 5,970,238 A    10/1999  Shibata et al.
6,225,697 B1 * 5/2001  Iguchi ................... 257/758
6,414,393 B2 * 7/2002  Sumino et al. ........... 257/758
6,504,254 B2 * 1/2003  Takizawa ................ 257/758
6,528,883 B1 * 3/2003  Dunham et al. .......... 257/758
6,664,642 B2 * 12/2003 Koubuchi et al. ........ 257/776
7,071,560 B2 * 7/2006  Kuroda et al. ........... 257/758
7,081,681 B2 * 7/2006  Suzuki ................... 257/784

FOREIGN PATENT DOCUMENTS

CN    1638048    7/2005
JP    05-055218  3/1993

* cited by examiner

*Primary Examiner*—S. V Clark  
(74) *Attorney, Agent, or Firm*—Jianq Chyun IP Office

(57) ABSTRACT

A method of disposing dummy patterns is described, which is used for increasing the pattern density of an aluminum pad layer. A substrate is provided, and an aluminum pad material layer is formed on the substrate. Then, the aluminum pad material layer is patterned to form the aluminum pad layer which includes a plurality of aluminum pads and a plurality of dummy patterns, wherein the dummy patterns are distributed in the spaces between the aluminum pads. Besides, routings can be further disposed in the aluminum pad layer and the dummy patterns are distributed in the spaces between the aluminum pads, between the aluminum pads and the routings, or between the routings.

20 Claims, 5 Drawing Sheets

METHOD OF DISPOSING AND ARRANGING DUMMY PATTERNS

BACKGROUND OF THE INVENTION

1. Field of the Invention

The present invention relates to a method of disposing and arranging dummy patterns. More particularly, the present invention relates to a method of disposing and arranging dummy patterns in an aluminum pad layer.

2. Description of Related Art

Generally speaking, semiconductor process can be roughly classified into front end process and back end process, wherein front end process includes processes such as formation of substrate, the deposition of film layers, lithography, etching, ion implantation, and metallic interconnects, and back end process is packaging process. Solder pads are formed on the substrate of the semiconductor before entering back end process to be used as signal joints for transmitting circuit signals of the IC to external circuit.

Presently, aluminum, copper, or other alloys are used for manufacturing solder pad. Wherein, copper solder pad has such advantages as low resistance, good anti-electromigration performance, and is ideal for dealing with high device integration. However, copper solder pad is easily destroyed during testing since the hardness thereof is low, and moreover, copper can be easily oxidized, extruded, contaminated, or diffused since copper is very active, which may cause problems during the step of bonding, or require additional cleaning step. Thus, aluminum is usually used as the material of solder pad.

In the conventional technology, to form aluminum pads, an aluminum film layer is first formed and then the aluminum film layer is processed with plasma etching. The proportion of the aluminum pads to the entire aluminum film layer is between 3%~6%, that is, large amount of the plasma gas needs to be used for removing large areas of aluminum film. Because of the pattern density of the aluminum pad is low, and that the etching machine used in general process is usually designed to etch film of high pattern density, a problem of insufficient process window is occurred of during the etching process of the aluminum pad. Accordingly, the dissociative plasma gas assembles around the aluminum pad pattern, which results in the problem of aluminum erosion and low reliability of the device.

In particular, the material of the aluminum pads is usually aluminum copper alloy containing trace copper, the more aluminum film to be etched and removed, the higher the probability of copper separate out is, thus, defects on the wafer are increased. FIG. 1 is a top view of a wafer after the wafer is completed with conventional aluminum pad etching. Referring to FIG. 1, the pattern density of the aluminum pads after plasma etching is about 4.96%, and there are many dot defects are produced at the center and the edge of the wafer 100.

SUMMARY OF THE INVENTION

Accordingly, the present invention is directed to a method of disposing dummy patterns between aluminum pads, which can resolve the problem of insufficient process window of the etching process and erosion to the aluminum pads.

According to another aspect of the present invention, a method of disposing dummy patterns between aluminum pads, between aluminum pads and routings, or between routings is provided, which can increase the pattern density of an aluminum pad layer.

According to yet another aspect of the present invention, a method of arranging dummy patterns is provided, wherein a known dark/clear ratio is provided and whether to dispose dummy patterns in an aluminum pad layer is determined.

The present invention provides a method of disposing dummy patterns for increasing the pattern density of an aluminum pad layer. According to this method, first a substrate is provided and an aluminum pad material layer is formed on the substrate. Next, the aluminum pad material layer is patterned to form the aluminum pad layer. The aluminum pad layer includes a plurality of aluminum pads and a plurality of dummy patterns, and the dummy patterns are distributed in the spaces between the aluminum pads.

According to the foregoing method of disposing dummy patterns, the dummy patterns are evenly distributed between the aluminum pads and are at appropriate distance from the aluminum pads.

According to the foregoing method of disposing dummy patterns, the material of the aluminum pad material layer includes aluminum, aluminum copper alloy, or aluminum silicon copper alloy.

According to the foregoing method of disposing dummy patterns, the substrate includes a radio frequency (RF) component, a capacitor, or an inductor.

According to the foregoing method of disposing dummy patterns, the dummy patterns are at appropriate distances from the RF component, the capacitor, or the inductor.

According to the foregoing method of disposing dummy patterns, the dummy patterns are formed in the spaces between the aluminum pads, so that the problem of insufficient process window can be avoided and accordingly the aluminum pad layer is prevented from being eroded, and the probability of dot effect can be reduced.

The present invention further provides a method of disposing dummy patterns for increasing the pattern density of an aluminum pad layer. According to the method, a substrate is provided and an aluminum pad material layer is formed on the substrate. Next, the aluminum pad material layer is patterned to form an aluminum pad layer. The aluminum pad layer includes a plurality of aluminum pads, at least a routings, and a plurality of dummy patterns. The dummy patterns are distributed in the spaces between the aluminum pads, between the routing, and between the aluminum pads and the routing.

According to the foregoing method of disposing dummy patterns, the dummy patterns are evenly distributed in the spaces between the aluminum pads, between the routing, and between the aluminum pads and the routing, and at appropriate distances from the aluminum pads and the routing.

According to the foregoing method of disposing dummy patterns, the material of the aluminum pad material layer includes aluminum, aluminum copper alloy, or aluminum silicon copper alloy.

According to the foregoing method of disposing dummy patterns, the substrate includes a RF component, a capacitor, or an inductor.

According to the foregoing method of disposing dummy patterns, the dummy patterns are at appropriate distances from the RF component, the capacitor, or the inductor.

According to the foregoing method of disposing dummy patterns, dummy patterns are disposed in the spaces between the aluminum pads, between the aluminum pads and the routings, or between the routings so as to prevent insufficient process window of the etching machine and erosion to the aluminum pad layer, and to reduce the probability of copper separate out and dot effect.

The present invention provides a method of arranging dummy patterns for increasing the pattern density of an aluminum pad layer. The aluminum pad layer is disposed on a substrate and has a plurality of patterns so that the aluminum pad layer has a predetermined pattern density. According to this method, a known dark/clear ratio is provided, wherein the known dark/clear ratio is the ratio of the dark area (the pattern area) of the aluminum pad layer to the overall area of the aluminum pad layer, and then the predetermined pattern density and the known dark/clear ratio are compared. The dummy patterns are not disposed if the predetermined pattern density is greater than the known dark/clear ratio, and the dummy patterns are formed in the spaces between the patterns if the predetermined pattern density is smaller than the known dark/clear ratio.

According to the foregoing method of arranging dummy patterns, the dummy patterns are evenly distributed in the spaces between the patterns and are at appropriate distances from the patterns.

According to the foregoing method of arranging dummy patterns, the previously disposed patterns include a plurality of aluminum pads.

According to the foregoing method of arranging dummy patterns, the previously disposed patterns further include a routing.

According to the foregoing method of arranging dummy patterns, the known dark/clear ratio is greater than or equal to 30%.

The foregoing method of arranging dummy patterns further includes dividing the substrate into a plurality of areas and comparing the predetermined pattern density and the known dark/clear ratio of each area.

The foregoing method of arranging dummy patterns further includes dividing the substrate into a plurality of areas in checkerboard, in concentric circles, or in the pattern combining checkerboard and concentric circles.

According to the foregoing method of arranging dummy patterns, the substrate includes a RF component, a capacitor, or an inductor.

According to the foregoing method of arranging dummy patterns, the dummy patterns are at appropriate distances from the RF component, the capacitor, or the inductor.

According to the foregoing method of arranging dummy patterns, the material of the aluminum pad layer includes aluminum, aluminum copper alloy, or aluminum silicon copper alloy.

According to the foregoing method of arranging dummy patterns, whether to dispose the dummy patterns is determined through the known dark/clear ratio, so that the requirement of process window of the etching process can be achieved more systematically. Moreover, the substrate is divided into a plurality of areas so that the number of dummy patterns to be disposed in each area can be increased, and the pattern uniformity on the substrate can be further increased and the performance of the device can be improved.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
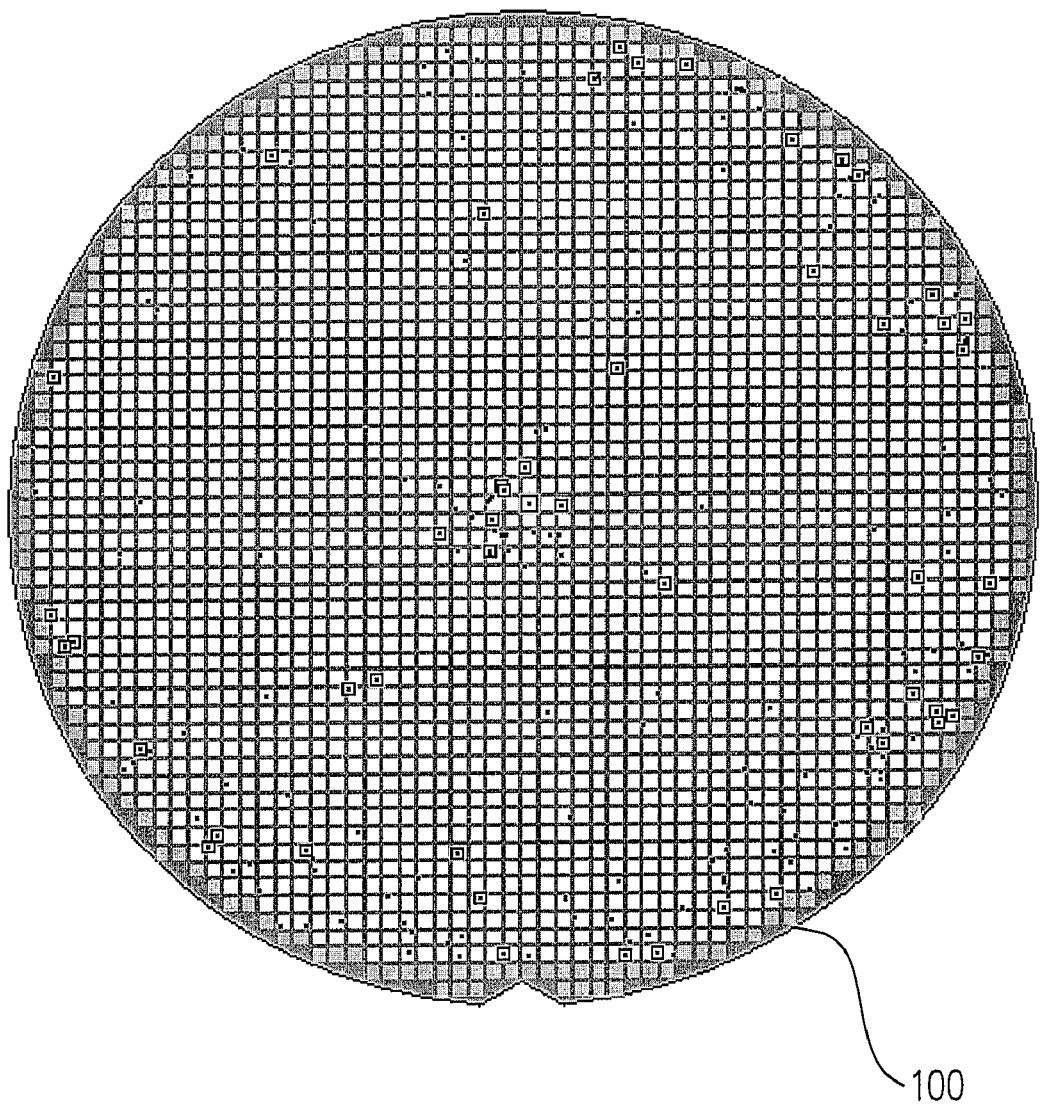
FIG. 1 is a top view of a wafer after the wafer is completed with conventional aluminum pad etching.
Figure 2A:
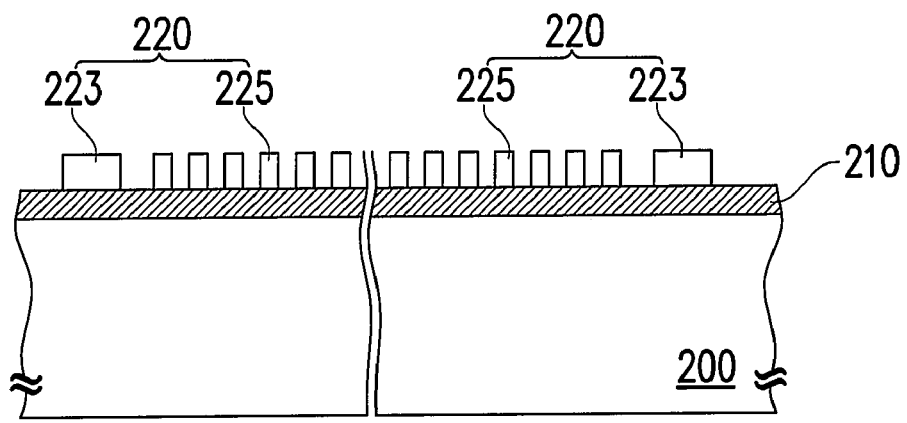
FIG. 2A is a cross-sectional view illustrating the fabricating flow of an aluminum pad layer disposed with dummy patterns according to an embodiment of the present invention.
Figure 2B:
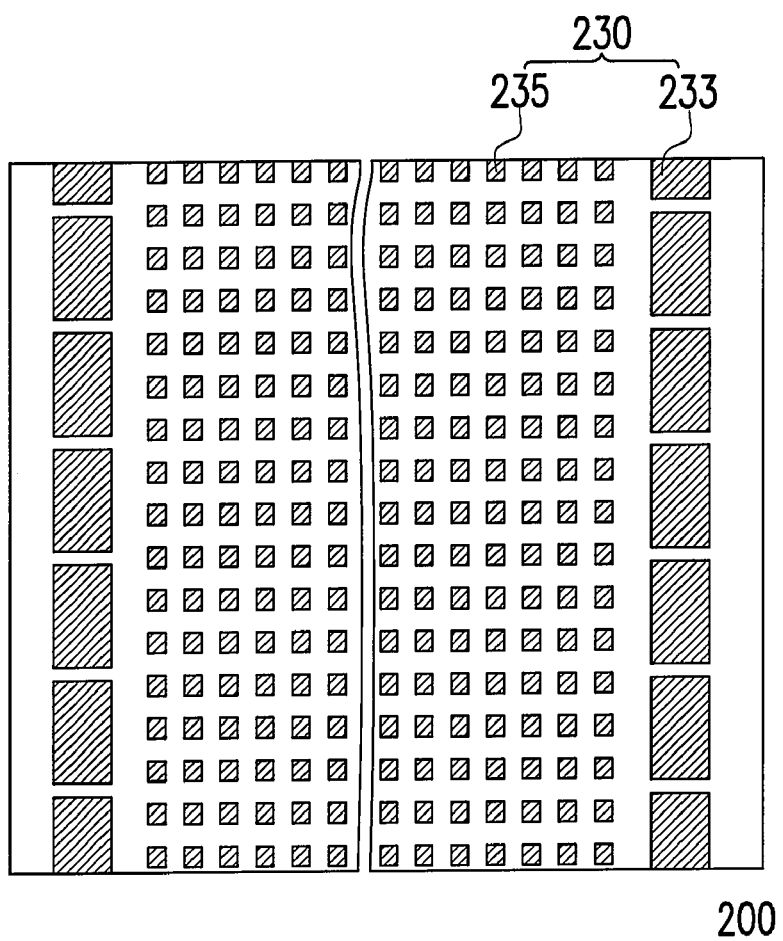
FIG. 2B is a top view illustrating the fabricating flow of an aluminum pad layer disposed with dummy patterns according to an embodiment of the present invention.

FIG. 2A is a cross-sectional view illustrating the fabricating flow of an aluminum pad layer disposed with dummy patterns according to an embodiment of the present invention. FIG. 2B is a top view illustrating the fabricating flow of an aluminum pad layer disposed with dummy patterns according to an embodiment of the present invention.

Referring to FIG. 2A, the method of disposing dummy patterns is used for increasing the pattern density of an aluminum pad layer. According to this method, first a substrate 200 is provided, which has other components (not shown) such as MOS, memory, resistor, capacitor, metallic interconnects etc. A dielectric material layer (not shown) is disposed over these components to be used as a passivation layer, and a layer of metallic interconnects is disposed in the passivation layer so that the passivation layer can be electrically connected to the aluminum pad layer formed subsequently.

Next, an aluminum pad material layer 210 is formed on the substrate 200. The material of the aluminum pad material layer 210 is, for example, pure aluminum, or aluminum bearing metals such as aluminum copper alloy with trace copper or aluminum silicon copper alloy.

After that, the aluminum pad material layer 210 is patterned to form the aluminum pad layer 230. The method of patterning the aluminum pad material layer 210 is, for example, first forming a photoresist layer 220, then removing a part of the aluminum pad material layer 210 with the photoresist layer 220 as mask, and then removing the photoresist layer 220.

Wherein, the method of forming the photoresist layer 220 comprises, for example, forming a photoresist layer (not shown) on the aluminum pad material layer 210 with spin coating, and then exposing with a mask and developing the patterns.

The photoresist layer 220 includes, for example, aluminum pad photoresist layers 223 and dummy pattern photoresist layers 225, and the dummy pattern photoresist layers 225 are disposed between the aluminum pad photoresist layers 223.

Next, referring to FIG. 2A and FIG. 2B, a part of the aluminum pad material layer 210 is removed using the photoresist layer 220 as mask to form the aluminum pad layer 230 which includes aluminum pads 233 and dummy patterns 235.

The method for removing a part of the aluminum pad material layer 210 includes, for example, plasma etching such as reactive ion etching.

Various components can be formed in the substrate 200 (the front layer of the aluminum pad layer 230), and metallic shield effect can be induced if the dummy patterns 235 are too close to the radio frequency (RF) component, the capacitor, or the inductor. Thus, if a RF component, a capacitor, or an inductor are disposed in the substrate 200, the dummy patterns 235 should be disposed at appropriate distances from these components for preventing metallic shield effect.

Besides, it should be noted that in FIG. 2B, the top cross-sectional view of the dummy patterns is rectangle, however, the top cross-sectional view of the dummy patterns may also be other geometric shapes such as triangle, quadrangle, circle etc, preferably circle.

According to the method of disposing dummy patterns described above, the dummy patterns 235 are disposed in the spaces between the aluminum pads 233, accordingly, the problem of insufficient process window of the etching process can be avoided and the aluminum pad layer can be prevented from being eroded, and the probability of dot effect can also be avoided.

Figure 3:
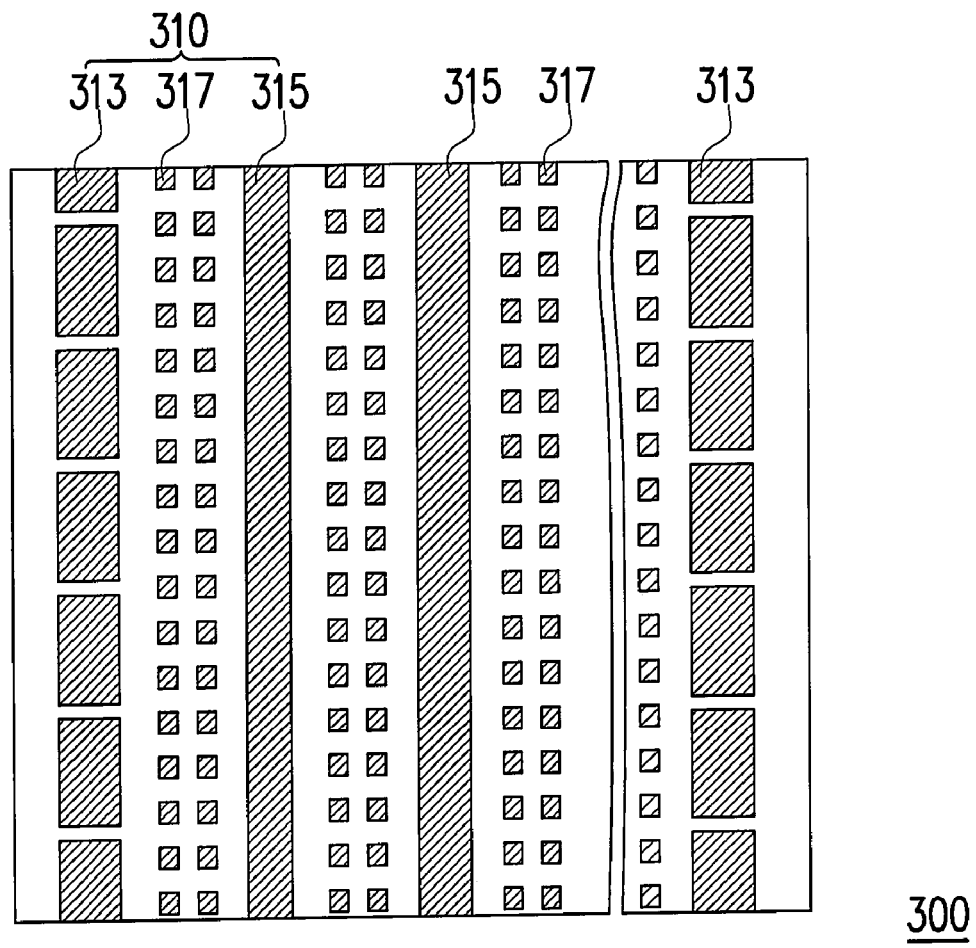
FIG. 3 is a top view illustrating the fabricating flow of an aluminum pad layer disposed with dummy patterns according to another embodiment of the present invention.

In another embodiment, besides being disposed with aluminum pads, the aluminum pad layer is also disposed with routings. The method of disposing dummy patterns in the aluminum pad layer will be described below. FIG. 3 is a top view illustrating the fabricating flow of an aluminum pad layer disposed with dummy patterns according to another embodiment of the present invention.

Referring to FIG. 3, in the present invention, the substrate 300 is first provided, and other components (not shown), such as MOS, memory, resistor, capacitor, metallic interconnects etc, have been formed in the substrate 300. A dielectric material layer is disposed over these components to be used as a passivation layer (not shown), and a layer of metallic interconnects is disposed in the passivation layer so that the passivation layer can be electrically connected to the aluminum pad layer formed subsequently.

Next, an aluminum pad material layer (not shown) is formed on the substrate 300. The material of the aluminum pad material layer includes, for example, pure aluminum, or aluminum bearing metals such as aluminum copper alloy with trace copper or aluminum silicon copper alloy.

After that, the aluminum pad material layer is patterned to form the aluminum pad layer 310. The method of patterning the aluminum pad material layer is, for example, first forming a photoresist material layer (not shown) on the aluminum pad material layer, and then exposing with a designed mask and developing the pattern to form the photoresist layer (not shown). After that, the aluminum pad layer 310 having aluminum pads 313, routings 315, and dummy patterns 317 is formed with the photoresist layer as the mask.

Wherein, the dummy patterns 317 are, for example, disposed in the spaces between the aluminum pads 313, between the aluminum pads 313 and the routings 315, or between the routings 315. The disposition of the dummy patterns 317 can prevent insufficient process window of the etching process and erosion to the aluminum pad layer, and can reduce the probability of copper separate out and dot effect.

The top cross-sectional view of the dummy patterns 317 in FIG. 3 is rectangle, and the top cross-sectional view of the dummy patterns 317 may also be other geometric shapes such as triangle, quadrangle, circle etc, but not limited to rectangle, preferably circle.

In particular, to prevent capacitor effect, an appropriate distance should be kept between the dummy patterns 317 and the routings 315. Moreover, similar to the previous embodiment, various components are disposed in the substrate (the front layer of the aluminum pad layer 310), and metallic shield effect may be caused if the dummy patterns 317 are disposed too close to the RF component, the capacitor, or the inductor. Thus, the dummy patterns 317 should be disposed at appropriate distances from the RF component, the capacitor, or the inductor disposed in the substrate 300 for preventing metallic shield effect.

Figure 4A:
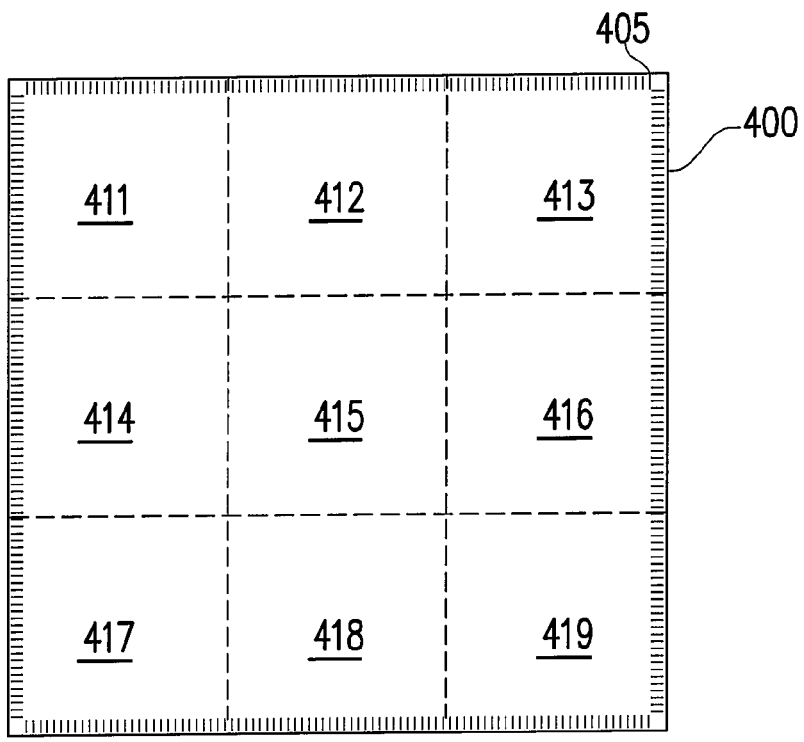
FIG. 4A illustrates the method of arranging dummy patterns according to an embodiment of the present invention.
Figure 4B:
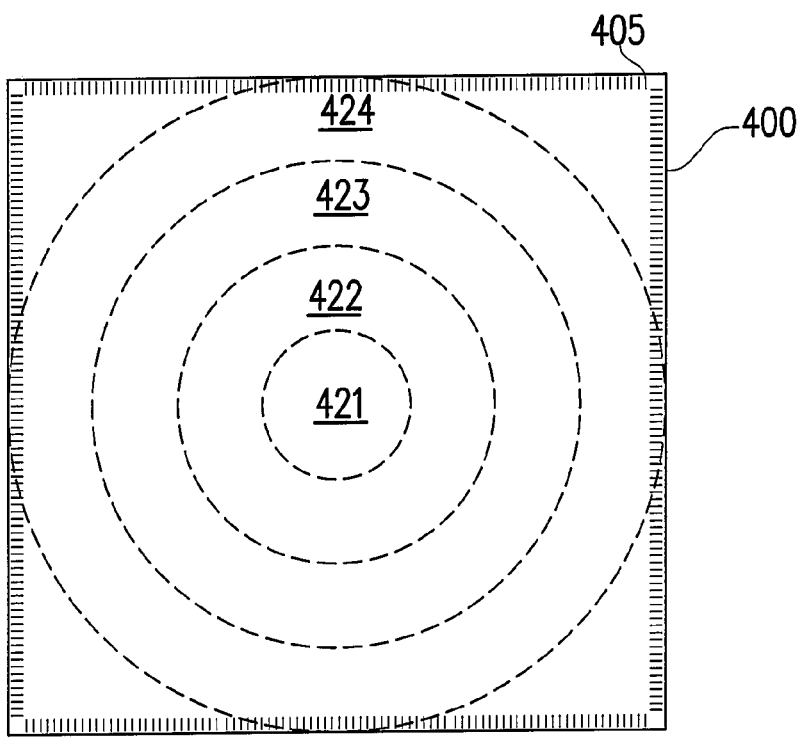
FIG. 4B illustrates the method of arranging dummy patterns according to another embodiment of the present invention.
Figure 4C:
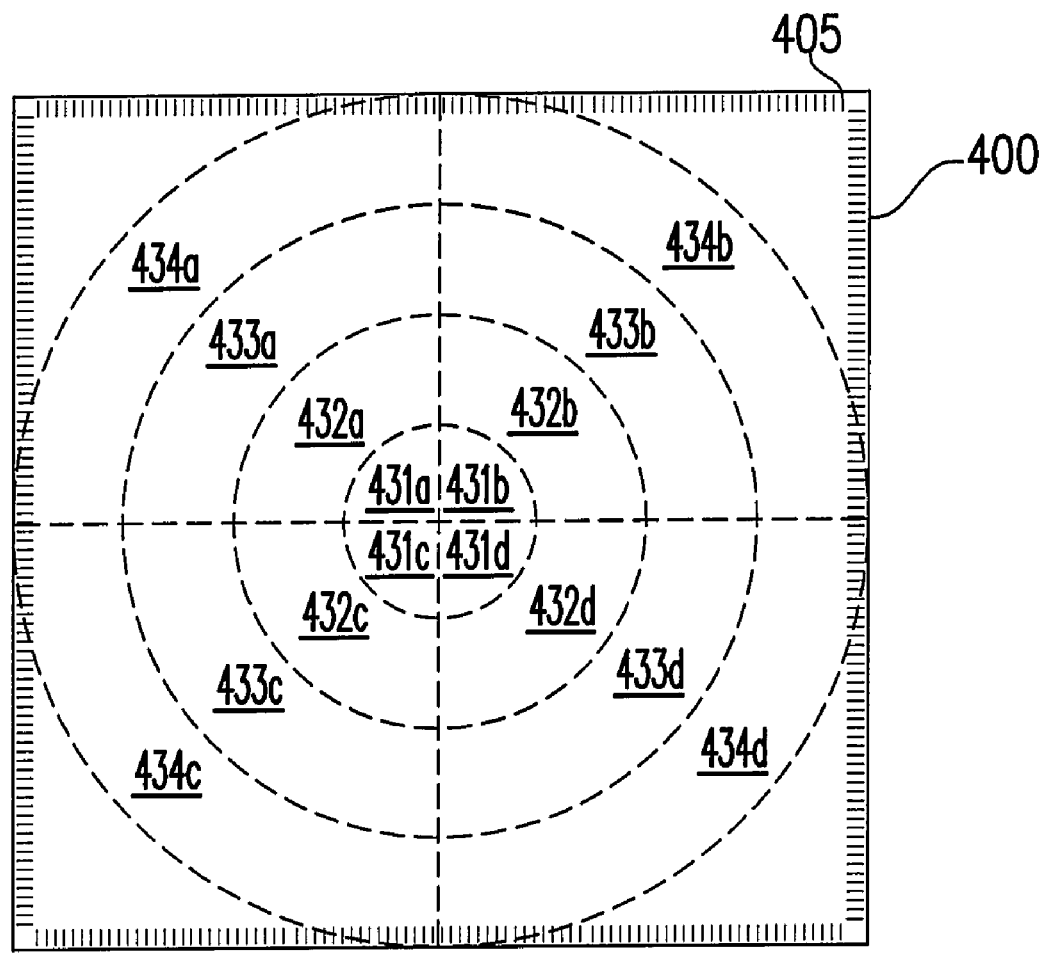
FIG. 4C illustrates the method of arranging dummy patterns according to yet another embodiment of the present invention.

Hereinafter, the method of arranging dummy patterns will be further described. FIG. 4A illustrates the method of arranging dummy patterns according to an embodiment of the present invention. FIG. 4B illustrates the method of arranging dummy patterns according to another embodiment of the present invention. FIG. 4C illustrates the method of arranging dummy patterns according to yet another embodiment of the present invention.

The present invention provides a method of arranging dummy patterns for increasing the pattern density of an aluminum pad layer. The aluminum pad layer is disposed on the substrate, and a plurality of patterns (such as aluminum pads, or aluminum pads and routings) has been disposed on the aluminum pad layer so that the aluminum pad layer has a predetermined pattern density.

The method of arranging dummy patterns includes, for example, providing a known dark/clear ratio which is a ratio calculated based on the component design and the process window of the etching process and refers to the proportion between the dark area (patterns area) in the aluminum pad layer and the overall area of the aluminum pad layer (i.e. the overall aforementioned aluminum pad material layer), and the ratio varies with etching conditions. In an embodiment, the known dark/clear ratio is 30%.

The dummy patterns are not disposed in the aluminum pad layer if the predetermined pattern density is greater than or equal to the known dark/clear ratio. The dummy patterns are disposed in the aluminum pad layer if the predetermined pattern density of the aluminum pad layer is smaller than the known dark/clear ratio.

In an embodiment, the predetermined pattern density of an aluminum pad layer is compared to the known dark/clear ratio thereof based on an entire chip. For example, the known dark/clear ratio is 30%, then a plurality of dummy patterns should be formed in the spaces between the aluminum pads, between the aluminum pads and the routings, between the routings on the entire chip if the predetermined pattern density of the aluminum pad layer is smaller than 30%, so that the area to be etched and removed won't be too large, which may result in insufficient process window of the etching process and aluminum erosion. The method of disposing the dummy patterns is as described in the foregoing two embodiments so will not be described again.

Besides the situation described in the previous embodiment, wherein whether to dispose the dummy patterns is considered based on the entire chip, the chip may also be divided into a plurality of areas so as to consider the pattern density and to determine whether to dispose dummy patterns of each area, and which will be described in detail below.

Referring to FIG. 4A, in an embodiment, a chip 400 is divided into a plurality of areas 411~419 in checkerboard. Here, the predetermined pattern density of the aluminum pads 405 in each of the areas 411~419 of the aluminum pad layer is compared to the known dark/clear ratio, and dummy patterns should be disposed in the area if the predetermined pattern density is smaller than the known dark/clear ratio. In FIG. 4A, the chip is divided into nine areas, and the chip may also be divided into four, sixteen, or other number of areas in checkerboard.

The chip can be divided into a plurality of areas in concentric circles besides in checkerboard.

Referring to FIG. 4B, in an embodiment, a chip is divided into a concentric circle 421 and a plurality of annuli 422, 423, and 424 from inside to outside. In the present embodiment, the predetermined pattern of the aluminum pads 405 in each area (the central circle 421 and the annuli 422, 423, 424) of the aluminum pad layer is compared to the known dark/clear ratio, and dummy patterns are disposed in the area if the predetermined pattern density thereof is smaller than the known dark/clear ratio. The number of areas the chip is divided into in concentric circles is not limited to four as shown in FIG. 4B, which may be determined according to the requirement of the design.

In the foregoing embodiments, the chip is respectively divided into a plurality of areas in checkerboard and in concentric circle. The chip may also be divided into a plurality of areas in the pattern combining checkerboard and concentric circles, as shown in FIG. 4C.

Referring to FIG. 4C, in the present embodiment, the chip is divided into 16 areas such as 431a, 431b, 431c, 431d, 432a, 432b, 432c, 432d, 433a, 433b, 433c, 433d, 434a, 434b, 434c, and 434d in the pattern combining checkerboard and concentric circles. Similarly, dummy patterns should be disposed in an area if the predetermined pattern density of the aluminum pads 405 in the area is smaller than the known dark/clear ratio. However, the division of the areas is not limited to 16 areas, and the number of areas to be divided can be determined according to the requirement.

In the foregoing embodiment, even though the aluminum pad layer having been previously disposed with the aluminum pads 405 is used as example in FIG. 4A, FIG. 4B, and FIG. 4C, routings can be further disposed in the aluminum pad layer based on the different design of the device. The predetermined pattern density of the aluminum pad layer with routings and aluminum pads should be calculated with all the previously formed aluminum pads and routings, and the predetermined pattern density is compared to the known dark/clear ratio. The other methods for comparing the predetermined pattern density and the known dark/clear ratio and for dividing the chip into a plurality of areas have been explained above, so will not be described again.

In the embodiments described above, the chip is divided into a plurality of areas in checkerboard, in concentric circle, and in the pattern combining checkerboard and concentric circle. However, the dividing manner is not limited to checkerboard or concentric circle, which may also be in strips, in diamond blocks etc. Moreover, the predetermined pattern density of the aluminum pad layer can also be considered based on an entire wafer or can be divided into a plurality of areas in checkerboard, in concentric circles etc.

In the area divisions described above, the number of dummy patterns to be disposed in each area can be determined so that the pattern uniformity on the chip or wafer can be further increased. Accordingly, insufficient process window of the etching process caused by low pattern density in a particular area of the aluminum pad layer can be avoided, so that the aluminum pad layer can be prevented from being eroded.

In summary, according to the methods of disposing and arranging dummy patterns in the present invention, dummy patterns are formed in the spaces (for example, between the aluminum pads, between the routings, or between the aluminum pads and the routings) of the aluminum pad layer so as to prevent the aluminum pads from being eroded due to insufficient process window of the etching machine, and further to improve the reliability of the device.

Besides, since dummy patterns are disposed in the aluminum pad layer, the aluminum film to be removed is reduced, which may reduce the probability of copper separate out and dot effect.

Moreover, in the present invention, the chip or wafer is divided into various areas, and the pattern density of each area is calculated to determine the number of the dummy patterns to be disposed. Such method of arranging dummy patterns can further increase the entire uniformity of the aluminum pad layer and can improved the performance of the device, and can adjust the etching space better.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of disposing dummy patterns for increasing the pattern density of an aluminum pad layer, the method comprising:
   providing a substrate;
   forming an aluminum pad material layer on the substrate; and
   patterning the aluminum pad material layer to form the aluminum pad layer, the aluminum pad layer comprising a plurality of aluminum pads and a plurality of dummy patterns, the dummy patterns being distributed in the spaces between the aluminum pads, wherein the area of the aluminum pads to the overall area of the aluminum pad layer is less than 30%.

2. The method as claimed in claim 1, wherein the dummy patterns are evenly distributed between the aluminum pads and are at distances from the aluminum pads.

3. The method as claimed in claim 1, wherein the material of the aluminum pad material layer comprises aluminum, aluminum copper alloy,or aluminum silicon copper alloy.

4. The method as claimed in claim 1, wherein the substrate comprises a radio frequency component, a capacitor, or an inductor.

5. The method as claimed in claim 4, wherein the dummy patterns are at distances from the radio frequency component, the capacitor or the inductor.

6. A method of disposing dummy patterns for increasing the pattern density of an aluminum pad layer, the method comprising:
   providing a substrate;
   forming an aluminum pad material layer on the substrate; and
   patterning the aluminum pad material layer to form the aluminum pad layer, the aluminum pad layer comprising a plurality of aluminum pads, at least a routing, and a plurality of dummy patterns, the dummy patterns being distributed in the spaces between the aluminum pads, between the routing, and between the aluminum pads and the routing, wherein the area of the aluminum pads and the routing to the overall area of the aluminum pad layer less than 30%.

7. The method as claimed in claim 6, wherein the dummy patterns are evenly distributed in the spaces between the aluminum pads, between the routing, and between the aluminum pads and the routing, and are at distances from the aluminum pads and the routing.

8. The method as claimed in claim 6, wherein the material of the aluminum pad material layer includes aluminum, aluminum copper alloy, or aluminum silicon copper alloy.

9. The method as claimed in claim 6, wherein the substrate comprises a radio frequency component, a capacitor, or an inductor.

10. The method as claimed in claim 9, wherein the dummy patterns are at distances from the radio frequency component, the capacitor, or the inductor.

11. A method of arranging dummy patterns for increasing the pattern density of an aluminum pad layer, the aluminum pad layer being disposed on a substrate and being previously disposed with a plurality of patterns so that the aluminum pad layer has a predetermined pattern density, the method comprising:
providing a known dark/clear ratio, wherein the known dark/clear ratio is the ratio of the dark area (the pattern area) of the aluminum pad layer to the overall area of the aluminum pad layer; and
comparing the predetermined pattern density and the known dark/clear ratio, wherein:
the dummy patterns are not disposed if the predetermined pattern density is greater than the known dark/clear ratio;
the dummy patterns are formed in the spaces between the patterns if the predetermined pattern density is smaller than the known dark/clear ratio.

12. The method as claimed in claim 11, wherein the dummy patterns are evenly distributed in the spaces between the patterns and are at appropriate distances from the patterns.

13. The method as claimed in claim 11, wherein the patterns comprise a plurality of aluminum pads.

14. The method as claimed in claim 13, wherein the patterns farther comprise a routing.

15. The method as claimed in claim 11, wherein the known dark/clear ratio is greater than or equal to 30%.

16. The method as claimed in claim 11 further comprising dividing the substrate into a plurality of areas and comparing the predetermined pattern density of each of the areas and the known dark/clear ratio.

17. The method as claimed in claim 16 farther comprising dividing the substrate into a plurality of areas in checkerboard, in concentric circle, or in the pattern combining checkerboard and concentric circle.

18. The method as claimed in claim 11, wherein the substrate comprises a radio frequency component, a capacitor, or an inductor.

19. The method as claimed in claim 18, wherein the dummy patterns are at appropriate distances from the radio frequency component, the capacitor, or the inductor.

20. The method as claimed in claim 11, wherein the material of the aluminum pad layer comprises aluminum, aluminum copper alloy, or aluminum silicon copper alloy.

* * * * *